United States Patent [19]
Goetz et al.

[11] Patent Number: 5,170,416
[45] Date of Patent: Dec. 8, 1992

[54] ENCODER DUTY-CYCLE ERROR CORRECTION

[75] Inventors: Howard V. Goetz, Tigard; Bruce D. Radke, Beaverton, both of Oreg.

[73] Assignee: Tektronix, Inc., Wilsonville, Oreg.

[21] Appl. No.: 716,438

[22] Filed: Jun. 17, 1991

[51] Int. Cl.[5] .......................................... H03K 21/10
[52] U.S. Cl. ..................................... 377/17; 377/3; 377/24; 377/56
[58] Field of Search ................. 377/3, 20, 24, 47, 17

[56] References Cited

U.S. PATENT DOCUMENTS

| | | | |
|---|---|---|---|
| 4,233,592 | 11/1980 | Leichle | 377/17 |
| 4,554,674 | 11/1985 | Sakai et al. | 377/17 |
| 4,612,656 | 9/1986 | Suzuki et al. | 377/24 |
| 4,628,521 | 12/1986 | Nishimura et al. | 377/24 |
| 4,860,051 | 8/1989 | Taniguchi et al. | 377/17 |
| 4,881,248 | 11/1989 | Korechika | 377/17 |
| 4,979,194 | 12/1990 | Kawano | 377/20 |
| 5,001,732 | 3/1991 | Nomura et al. | 377/3 |
| 5,058,145 | 10/1991 | Hauck et al. | 377/47 |

Primary Examiner—John S. Heyman
Attorney, Agent, or Firm—John D. Winkelman; Richard B. Preiss

[57] ABSTRACT

The present invention (50) corrects duty-cycle errors generated by imperfections in encoder scales and encoder detectors. A preferred embodiment of the invention operates by detecting successive transparent-to-opaque transitions of the encoder scale (20), calculating the distance between the transitions, dividing that distance by two, and generating a synthetic encoder pluse that is timed to represent a position 50 percent of the distance between the transparent-to-opaque transitions.

16 Claims, 6 Drawing Sheets

ENCODER DUTY-CYCLE ERROR CORRECTION

TECHNICAL FIELD

The present invention relates to a method and system for determining the position of a print head with respect to printing media and, in particular, to such a method and system that corrects for errors in the detection of the position of edges of opaque regions of an encoder scale.

BACKGROUND OF THE INVENTION

Ink jet printers eject ink onto a print medium, such as paper, in controlled patterns of closely spaced dots. FIG. 1 is a schematic of a print system including a prior art multi-orifice ink jet print head array 10. To print dots on all major portions of a paper 16, print head array 10 is shuttled back and forth on guide rail 14 in the X direction, as shown in FIG. 1, as paper 16 is advanced in the Y direction. Edges 18A and 18B represent the respective left and right edges of paper 16.

Because it takes a finite time for an ink drop to travel from print head 10 to paper 16, print head 10 ejects an ink drop from a particular orifice before the orifice is aligned with the intended destination ("the target") of the drop. If an ink drop is ejected too early or too late, the ink drop will not strike the target. For print head 10 to eject the drop at the precise time, the controller of the print head must know the position of print head 10 with respect to paper 16.

An encoder scale 20, which is made of clear mylar base material, is suspended between supports 24A and 24B. Encoder scale 20 may also be made from more expensive materials such as thin glass or etched metal. Many regularly spaced regions 28 of opaque material are photographically printed along the length of encoder scale 20, as shown in FIG. 2. Encoder scale 20 is manufactured by Litchfield Precision Co.

Referring to FIG. 1, an encoder 34 is mounted to print head 10. Encoder 34 may be a model HEDS-9200, option P, encoder module marketed by Hewlett-Packard Corporation, Palo Alto, Calif. FIG. 3A shows a cross-sectional side view of the print system of FIG. 1, taken along lines 3—3. Referring to FIG. 3A, encoder 34 includes a light emitting diode (LED) 36, which emits collimated light toward a photodiode array 38. Referring to FIG. 3B, which is an enlarged front view of encoder 34, photodiode array 38 contains many photodiodes separated into two spatially distinct groups referred to herein as photodetector 40 and photodetector 42.

The outputs of the individual photodiodes in photodetector 40 are processed so that the output of photodetector 40 behaves as though photodetector 40 were a discrete photodetector of very small width in comparison with the width of one of opaque regions 28. The output of photodetector 42 similarly behaves as though photodetector 40 were a discrete photodetector of very small width in comparison with the width of one of opaque regions 28.

The outputs of the photodiodes in photodectors 40 and 42 are processed to produce respective nominally identical, 90° phase-displaced SIN and COS signals. In the present invention, the COS signal is used only to determine the direction in which print head 10 is traveling.

FIG. 2 illustrates the voltage level of the SIN signal as encoder 34 is advanced along encoder scale 20. Referring to FIG. 2, opaque regions 28A, 28B, 28C, and 28D are spaced between clear regions 30A, 30B, 30C, 30D, and 30E. There are typically 150 of opaque regions 28 per inch (150 lpi) (5.9 opaque regions per millimeter (mm)) evenly spaced between clear regions 30. Accordingly, opaque regions 28 and clear regions 30 are each 0.0033 inches (0.0847 mm) wide. A first edge 44 of opaque region 28A is referred to as the positive edge, and a second edge 46 of opaque region 28A is referred to as the negative edge.

At time t0, photodetector 40 is positioned so that light from LED 36 is unimpeded by one of opaque regions 28 and, consequently, the SIN signal is a logic 0 ("low"). At about time t1, photodetector 40 moves past the positive edge of opaque region 28A. The voltage of the SIN signal rapidly increases to a logic 1 ("high").

A dot clock (not shown) provides output pulses at both the rising and falling edges of the SIN signal. Accordingly, the dot clock produces a pulse in response to the rising edge of the SIN signal at about time t1. At about time t2, photodetector 40 moves past the negative edge of opaque region 28A. Ideally, the state of the output of photodetector 40 would respond instantaneously to a change in detected light. However, stored charge and junction capacitance in photodetector 40 or some other reason causes the voltage of the SIN signal to decrease in response to a negative edge of an opaque region 28 much more slowly than the SIN signal increases in response to a positive edge. The dot clock does not produce a pulse in response to the negative edge until time t3. The relative time between times t2 and t3 is exaggerated to illustrate that the dot clock pulses are not evenly spaced apart. At about time t4, photodetector 40 traverses opaque region 28B. The voltage of the SIN signal rapidly increases to the high state, and the dot clock produces a pulse at about time t4. At about time t5, the SIN photodetector 40 moves past opaque region 28B; however, because of the slow response time of the SIN signal, the dot clock does not produce a pulse until about time t6.

The dot clock pulses indicate the position of print head 10 to the control system (not shown). As can be seen from FIG. 2, the dot clock pulses are not evenly spaced. (Errors in the spacing between adjacent dot clocks pulses are often much greater than ±7 percent.) Therefore, the control system will not always know the precise location of print head 10. For example, the control system will not know that print head 10 has passed opaque region 28A after a time delay following time t3. Depending on the standards of the precision of the particular printer, the time delay in the receipt of print head position information by the control system may be significant.

The difference in the rise and fall times of the SIN signal is not the only cause of lack of uniformity in dot clock pulse spacing. The problem may be enhanced by nonuniform sizes of opaque regions 28 printed on encoder scale 20.

One partial solution to the problem is to provide encoder scale 20 with a larger number of opaque regions, such as 300 opaque regions per inch (11.8 opaque regions per mm) rather than 150 opaque regions per inch (5.9 opaque regions per mm). An encoder capable of recognizing 300 opaque regions per inch (300 lpi encoder) could be used to produce an output pulse only in response to the detection of a positive edge. A major problem with this solution is that a 300 lpi encoder is much more expensive than an 150 lpi encoder, such as encoder 34. Moreover, a 300 lpi encoder is much more bulky, fragile, harder to apply, and less readily available than a 150 lpi encoder.

There is, therefore, a need for a method and system using relatively inexpensive components for accurately determining the position of a print head with respect to printing media.

SUMMARY OF THE INVENTION

An object of the invention is, therefore, to provide a method and system using relatively inexpensive components for accurately determining the location of a print head with respect to a printing medium, such as paper.

The present invention corrects duty-cycle errors generated by imperfections in encoder scales and encoder detectors. Such duty-cycle errors lead to incorrect determinations of print head position. A preferred embodiment of the invention operates by detecting successive transparent-to-opaque transitions of the encoder scale, calculating the distance between the transitions, dividing that distance by two, and generating a synthetic encoder pulse that is timed to represent a position 50 percent of the distance between the transparent-to-opaque transitions.

Additional objects and advantages of the present invention will be apparent from the detailed description of a preferred embodiment thereof, which proceeds with reference to the accompanying drawings.

DETAILED DESCRIPTION OF PREFERRED EMBODIMENT

Figure 4A:
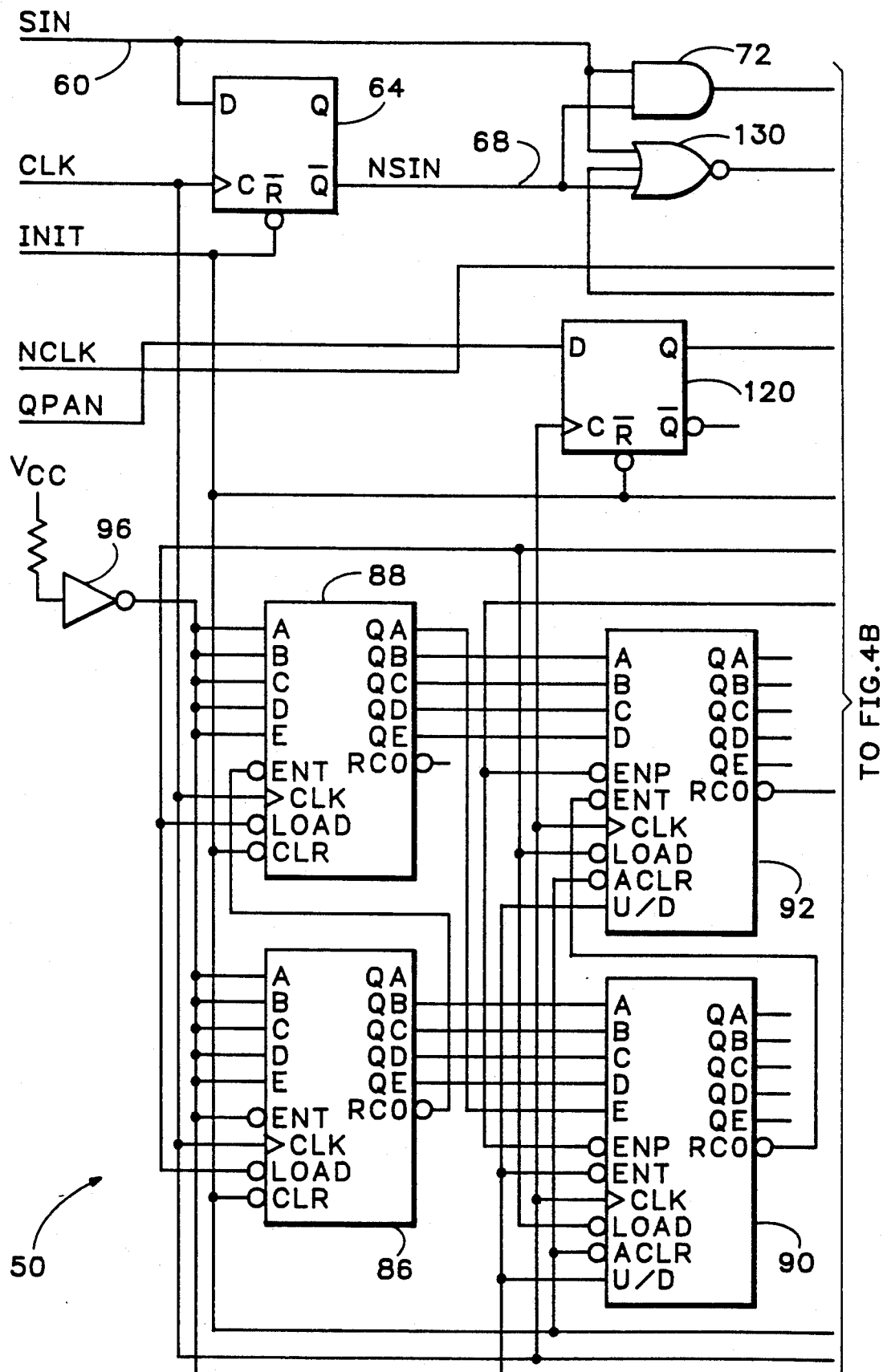
FIGS. 4(A&B) are a diagram of an electrical circuit used to generate correctly spaced dot clock pulses according to the present invention.
Figure 4B:
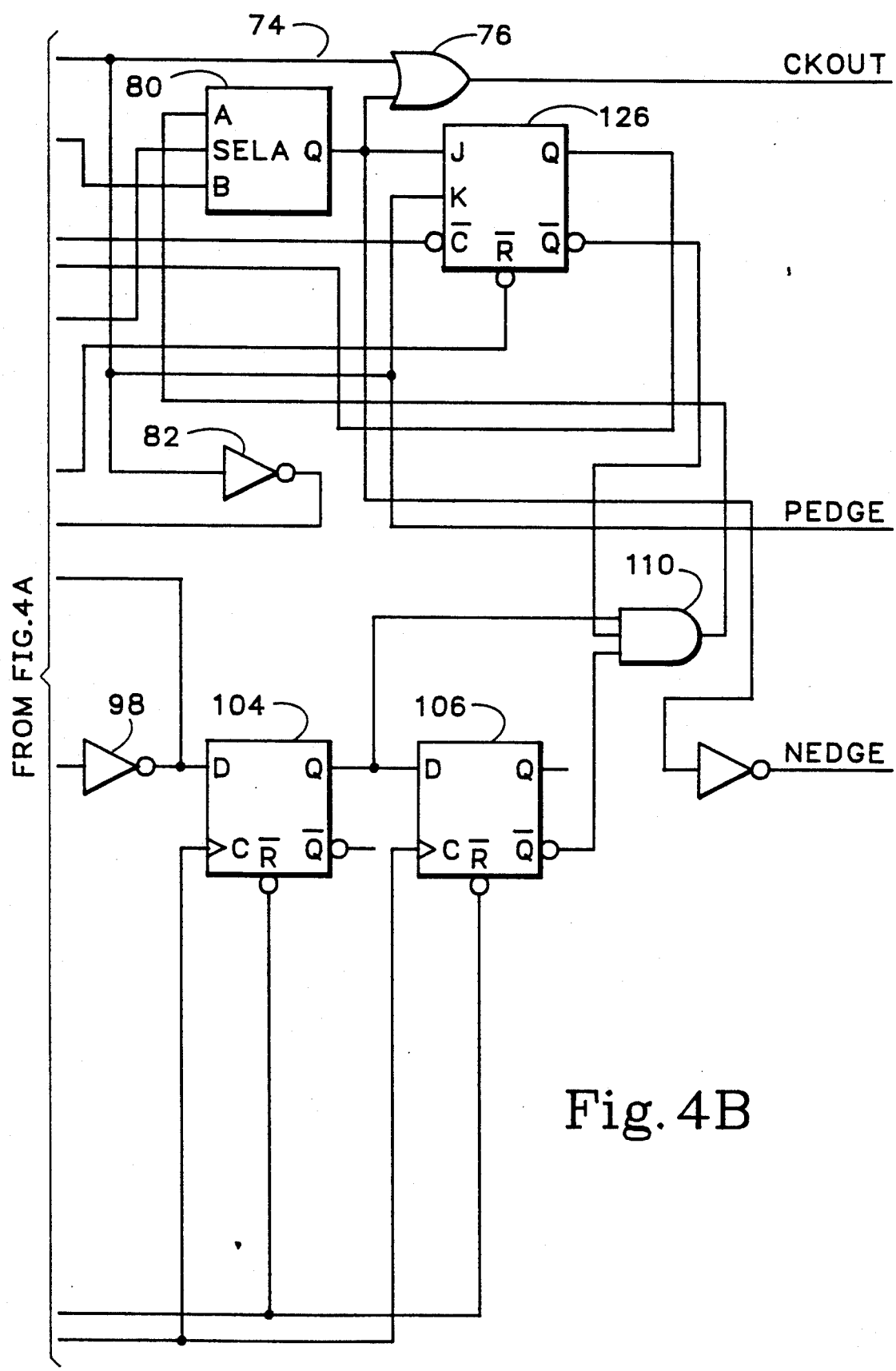

FIGS. 4(A&B) are a schematic of circuit 50 according to the present invention, the operation of which is explained in connection with the timing diagram of FIG. 5. FIG. 6 is a schematic of controller 52, which receives signals from encoder 34 and supplies a 2 MHz clock signal CLK (and its inverse NCLK), an initialization signal INIT, and a print window signal QPRN to circuit 50. The present inventor is used to accurately determine the position of a print head preferably of the type depicted in FIGS. 1, 2, 3A, and 3B. Circuit 50 and controller 52 are preferably located outside or print head 10 to reduce its size and weight.

Referring to FIGS. 4(A&B) and 5, at time t0 the SIN photodetector is positioned so that light emitted by LED 36 is unimpeded by one of opaque regions 28 and, consequently, the SIN signal is in a logic 0 state ("low"). At about time t1, the SIN photodetector traverses opaque region 28A. The voltage of the SIN signal rapidly increases to a logic 1 state ("high").

Figure 1:
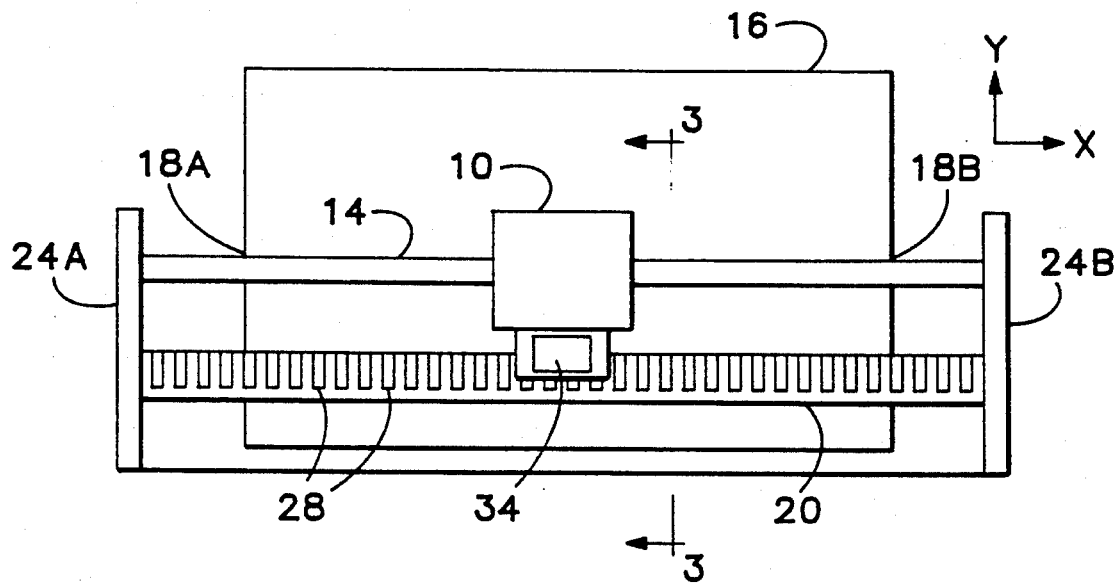
FIG. 1 is a simplified schematic representation of a prior art print system that includes a subsystem for determining the position of a print head.
Figure 3A:
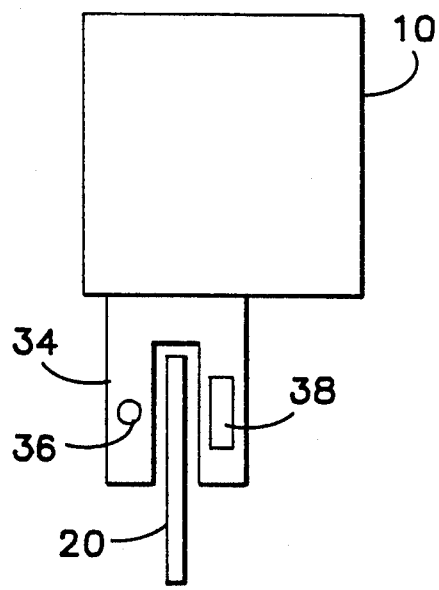
FIG. 3A is a cross-sectional schematic representation of the system taken along lines 3—3 of FIG. 1.
Figure 3B:
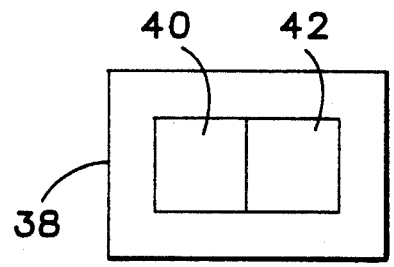
FIG. 3B is an enlarged schematic diagram of the photodetector arrays of a prior art encoder shown in FIG. 3A.
Figure 2:
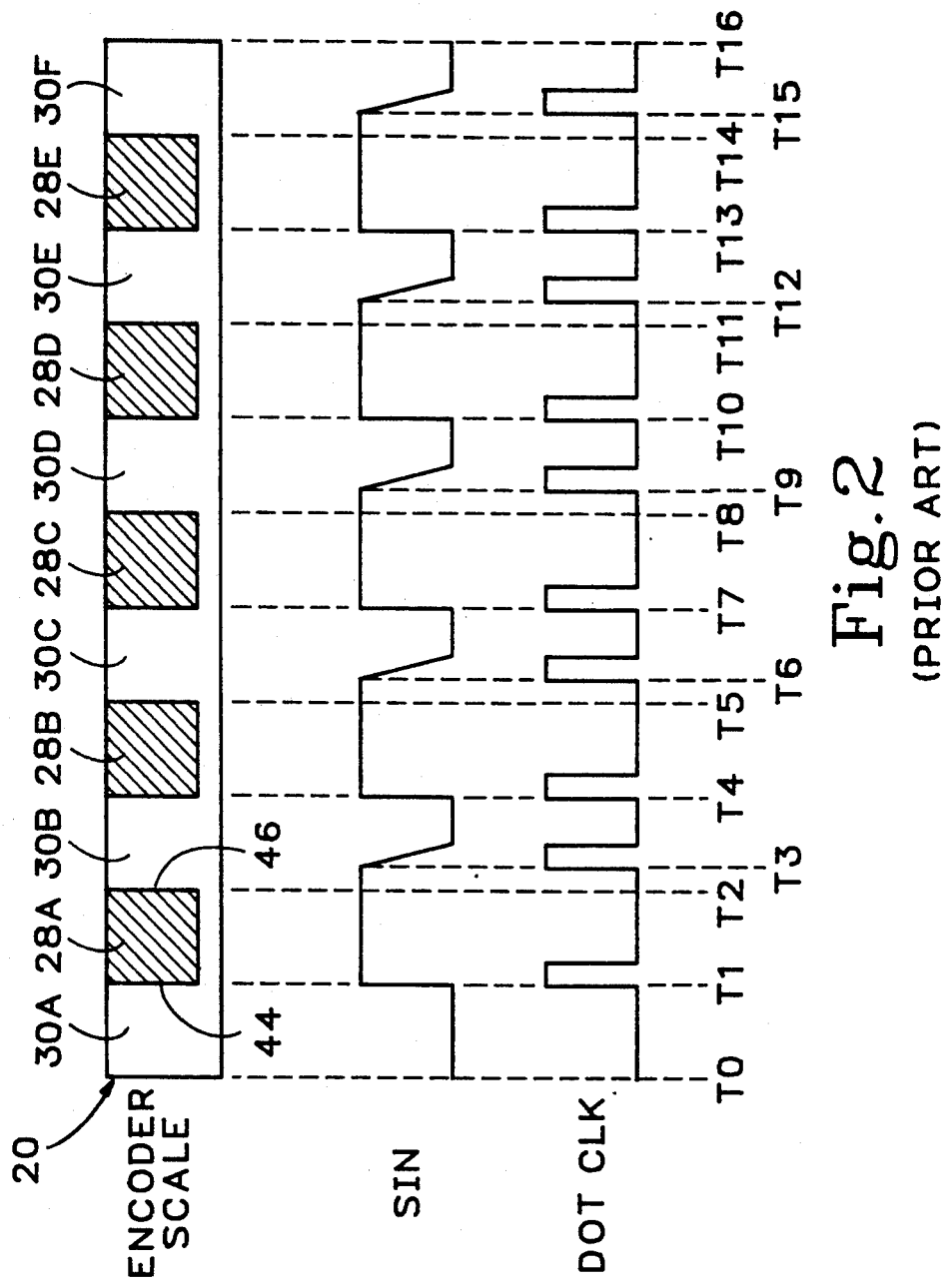
FIG. 2 is a timing diagram showing the voltage level of the SIN signal and dot clock as a function of time as the SIN photodetector passes along the encoder scale of the prior art system of FIG. 1.

Circuit 50 receives the SIN signal on a conductor 60 from the SIN photodetector of the prior art system of FIG. 1. A D flip-flop 64 receives the SIN signal and produces an NSIN signal (which is the inverse of the SIN signal) at the $\overline{Q}$ output, which is connected to a conductor 68. Flip-flop 64 is clocked by the 2 MHz CLK signal. The SIN signal on conductor 60 and the NSIN signal on conductor 68 are applied to different inputs of an AND gate 72.

The SIN signal and the NSIN signal are high following the time the SIN signal changes from low to high at time t1, but before the CLk signal clocks flip flop 64 and AND gate 72 produces an output pulse. The output of AND gate 72 is conveyed on conductor 74 to one of two inputs of an OR gate 76. The other input to OR gate 76 is connected to the output of a multiplexer 80, as is described below. The output of OR gate 76 is shown in FIG. 5 as the CKOUT (i.e., dot clock out) signal, which performs the function of the prior art dot clock. The CKOUT signal is briefly high following time t1 in response to the pulse from the output of AND gate 72.

The output of AND gate 72 is received by an inverter 82, the output of which is connected to the active low LOAD inputs of counters 86, 88, 90, and 92. Therefore, counters 86, 88, 90, and 92 load in response to the positive edge of the SIN signal an begin counting simultaneously.

Counters 86 and 88 are both five-bit up-counters with count preset inputs set to a logic 0 state by an inverter 96 whose input is fixed at a logic 1 state. The bits of counter 88 are more significant (i.e., of higher order) than the bits of counter 86. Counter 90 is a four bit down-counter, and counter 92 is a five-bit down-counter, with the bits of counter 92 being more significant than the bits of counter 90.

Counters 86 and 88 accumulate a count proportional to the length of time between the positive edges of successive opaque regions 28 of encoder scale 20. For example, counters 86 and 88 begin counting up from zero in response to the detection by the SIN photodetector of the positive edge of opaque region 28A at time t1. (Of course, counter 88 does not begin counting up until the enable input of counter 88 receives a signal from the ripple carry output (RCO) of counter 86.) Counters 86 and 88 continue to count up until they are loaded again in response to the detection by the SIN photodetector of the positive edge of opaque region 28B at time t4.

In response to their LOAD inputs being low, down-counters 90 and 92 load an initial count, which is one-half of the final count of counters 86 and 88. (Of course, counter 92 does not begin to count down until a the enable input of counter 92 receives a signal from the RCO output of counter 90). The initial count is derived as follows. The nine most significant bits (MSBs) of the outputs of counters 86 and 88 are applied to the nine inputs of counters 90 and 92 in the order of their significance. For example, the MSB of counter 86 is applied to the MSB of counter 90, and the second most least significant bit (LSB) of the output of counter 86 is applied to the LSB of counter 90. The LSB of the counter 86 is not used. In other words, the output of the 10-bit up counter formed by counters 86 and 88 is right-shifted by one bit position (thereby dividing the weight value by two) and loaded into the 9-bit down counter formed by counters 90 and 92.

When the count of counters 90 and 92 has reached zero, the RCO output of counter 92 generates a pulse that is received by an inverter 98. The output of inverter 98 disables counters 90 and 92 through their ENP inputs to inhibit extraneous count pulses.

The output of inverter 98 is also received by the D input of a D flip-flop 104. The Q output of flip-flop 104 is received by the D input of a D flip-flop 106 and an input of a three input AND gate 110. Flip-flops 104 and 106 prevent the appearance of extraneous pulses at the output of inverter 98 and synchronize the single remaining pulse to the CLK signal. The $\overline{Q}$ output of flip-flop 106 is applied to a second input of AND gate 110. The conditions under which the third input of AND gate 110 is high are explained in connection with other components of circuit 50. The output of AND gate 110 is briefly high at the time that circuit 50 predicts that the SIN photodetector will move past the negative edge of an opaque region 28. It will be appreciated that circuit 50 is predictive in that the count accumulated during the period of time between two opaque regions 28 of encoder scale 20 is divided by two and down-counted to zero at a time that predicts the halfway point between the next two adjacent opaque regions 28.

A QPRN signal, which is provided by system controller 52 shown in FIG. 6, is used to select between either "correcting" for or "not correcting" for the inaccurate out clock signals (i.e., dot clock) described above in connection with the prior art. When the QPRN signal is high, the output signal is corrected. When the QPRN signal is low, the output signal is uncorrected.

The QPRN signal is high when print head 10 is located inside a print window, and the QPRN signal is low when print head 10 is located outside the print window. The location of print head 10 is represented by the count of a master counter (not shown). The print window is defined by a range of master counter counts bounded by a left edge count and a right edge count. The left edge count is the count of the master counter when print head 10 is a small number of counts to the left of left edge 18A of paper 16. The right edge count is the count of the master counter when print head 10 is a small number of counts to the right of right edge 18B of paper 16. The values of the left and right edge counts are stored in a programmable read-only memory.

A purpose of the QPRN signal is as follows. Print head 10 is ordinarily shuttled back and forth along guide rail 14 at a rate of about 0.675 meters per second. When print head 10 travels at this speed, counter 88 will not overflow. Print head 10 slows down, however, as it approaches either support 24A or support 24B to prepare to stop and travel in the opposite direction. When print head 10 travels at a slow speed, counter 88 may overflow thereby leading to inaccurate counts. To prevent the overflow of counter 88 from causing problems, the QPRN signal goes low to cause multiplexer 80 to select its B input. When the select B input is selected, the count of counters 86, 88, 90, and 92 does not affect the CKOUT signal, which appears at the output of OR gate 76. As soon as the count of the master counter equals either the left or right edge count, the QPRN signal goes high and multiplexer 80 again selects its A input.

The QPRN signal is applied to the D input of a D flip-flop 120, the Q output of which is applied to the select A input of multiplexer 80. When the QPRN signal is high, the select A input is high and multiplexer 80 passes input A to the Q output of multiplexer 80. When the QPRN signal is low, the select A input is low and multiplexer 80 passes input B to the Q output of multiplexer 80. Select input A receives the output of AND gate 110 when CKOUT is "duty-cycle corrected" and the output of a NOR gate 130 when CKOUT is "duty-cycle uncorrected." The output of multiplexer 80, which when inverted is referred to as NEDGE (i.e., the negative edge of an opaque region 28), is received by an input of OR gate 76. Multiplexer 80 provides a pulse in response to the negative edge of an opaque region 28. If the output signal is duty-cycle corrected, the pulse occurs very near to the exact time the SIN photodetector crosses the negative edge of an opaque region 28 (assuming a 50 percent duty-cycle encoder scale). If the output signal is duty-cycle uncorrected, the pulse occurs sometime after the exact time the SIN photodetector crosses the negative edge of an opaque region 28. As noted above, the other input to OR gate 76 is the output of AND gate 72, which provides a pulse in response to the positive edge of an opaque region 28.

The output of multiplexer 80 is also received by the J input of a JK flip-flop 126. The purpose of flip-flop 126 is to mask any negative edge signals at the boundaries of the print window, which is controlled by the state of the QPRN signal. The K input to flip-flop 126 is connected to the output of AND gate 72. Accordingly, the pulse produced in response to the beginning of an opaque region 28 causes $\overline{Q}$ of flip-flop 126 to go high, and a pulse produced in response to the end of an opaque region 28 causes Q of flip-flop 126 to go high. The Q output of flip-flop 126 is connected to an input to three-input NOR gate 130, the output of which is connected to the B select input of multiplexer 80.

When a negative edge of an opaque region 28 is detected, flip-flop 126 is set, which prevents NOR gate 130 or AND gate 110 from producing a high output signal until flip-flop 126 is reset through the K input by the next positive edge from the output of AND gate 72.

Figure 5:
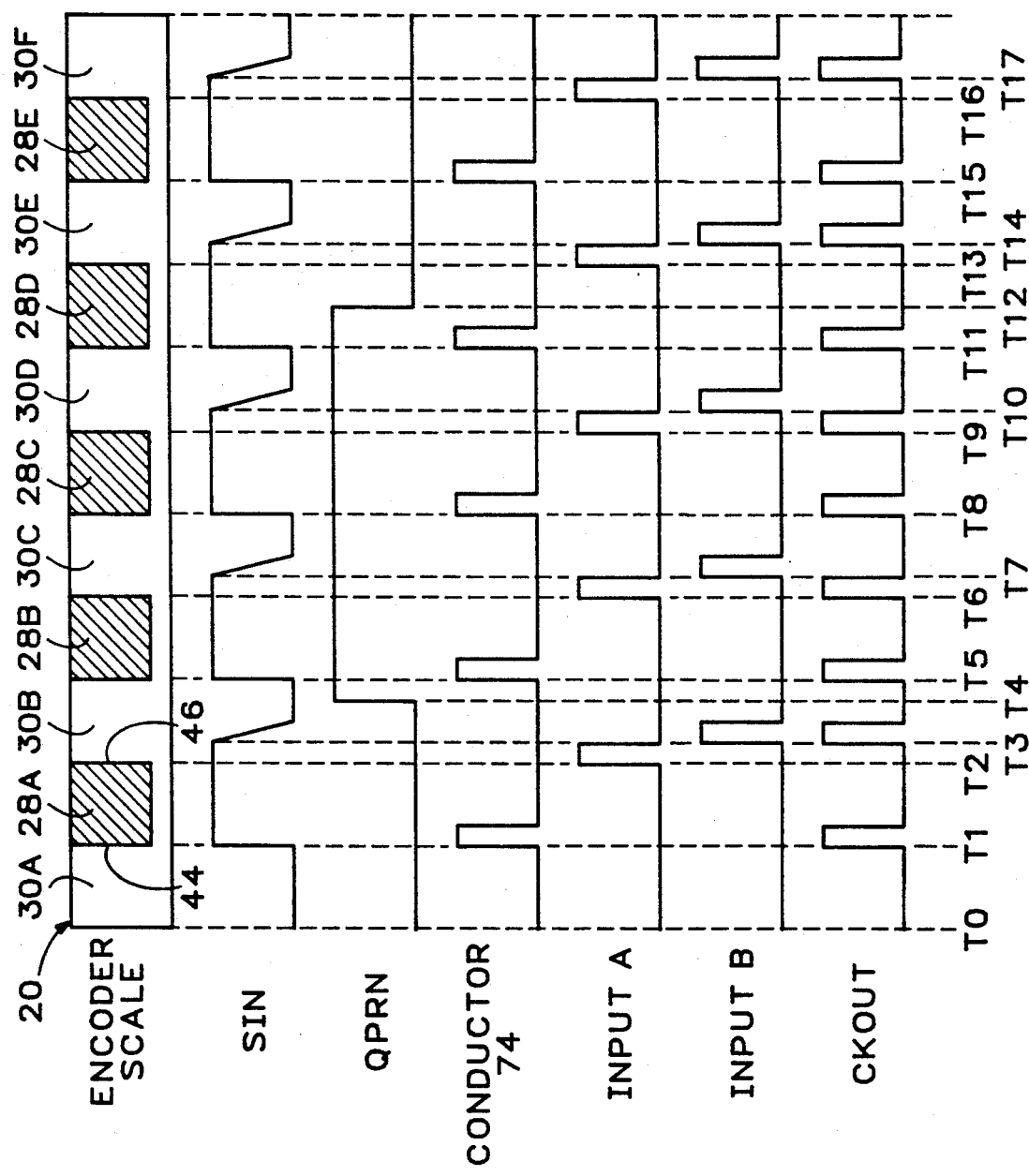
FIG. 5 is a timing diagram showing the voltage and timing relationships of various signals produced by the circuit of FIG. 4.
Figure 6:
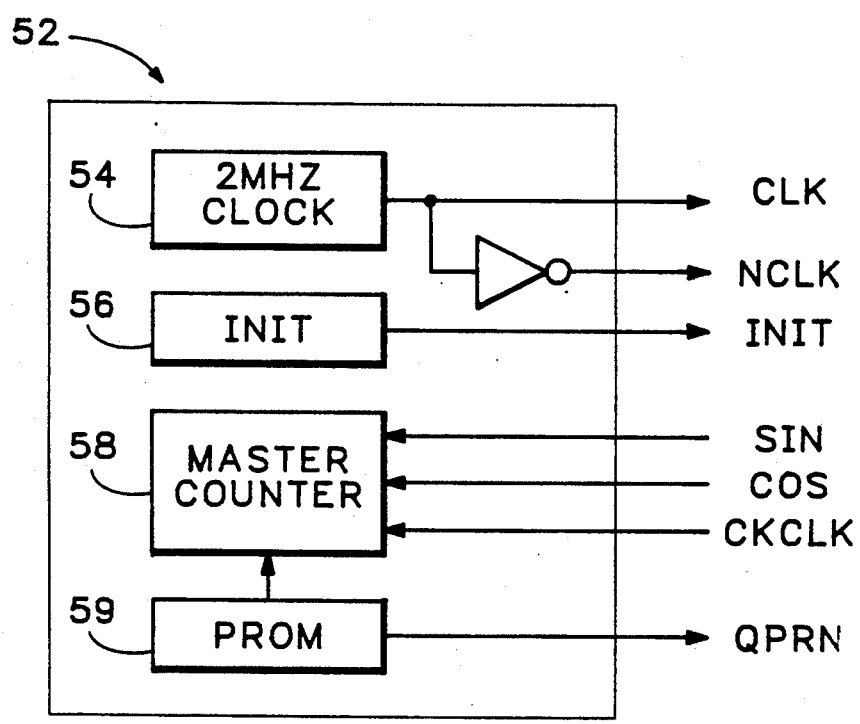
FIG. 6 is a simplified schematic representation of control circuitry that receives the correctly spaced dot clock pulses produced by the circuit of FIG. 4 to accurately position the print head.

Referring to FIG. 5, from time t0 to time t4, the QPRN signal is low and printing is duty-cycle uncorrected. Therefore, multiplexer 80 passes the signal present at select input B to OR gate 76. Select input B is connected to the output of NOR gate 130, which provides a pulse in response to the falling edge of the SIN signal at time t3. The time between time t2 and time t3 represents the error in the determination of the position of the print head.

At time t4, the QPRN signal is high and printing is duty-cycle corrected. Therefore, multiplexer 80 passes the signal present at select input A to OR gate 76. Select input A is connected to the output of AND gate 110, which provides a pulse at the time circuit 50 predicts SIN photodetector will pass by the negative edge of an opaque region 28 (again assuming a 50 percent duty-cycle encoder scale). Consequently, the spaces between pulses of the CKOUT signal are evenly spaced from time t4 to time t12 when the QPRN signal is returned to low.

Counters 86 and 88 accumulate a first count representing the width between two successive opaque regions 28, while counters 90 and 92 count down one-half of the first count to provide a second count representing the width of the first of the two adjacent regions 28. For example, at time to, counter 86 begins counting from zero when the SIN photodetector detects the positive edge of opaque region 28C and counter 90 begins counting down from the final count of counters 86 and 88. The final count represents the time between the positive edge of opaque region 28B and the positive edge of opaque region 28C. Therefore, circuit 50 uses information from the previous opaque region 28 to predict the location of the negative edge of the next succeeding opaque region 28D. The system makes an assumption that the speed at which the print head is shuttled is substantially constant.

FIG. 6 is a simplified block diagram of control CLK is generated by a 2 MHz oscillator circuit. INIT is generated only during initial power turn on by INIT circuit 56. A master counter 58 maintains a numerical representation of the print head position by using the SIN, COS, and CKOUT signals described previously. PROM 59 examines master counter 58 and generates the print window signal QPRN when master counter 58 contains numbers within a predetermined range of values.

Many changes may be made in the above-described preferred embodiment of the present invention without departing from the underlying principles thereof. For example, counters 86, 88, 90, and 92 could be replaced by counters of amounts different from five and four bits and be clocked by other than a 2 MHz clock. Fewer bits would reduce cost, and more bits would add accuracy and speed variation tolerance. Adding bits would also facilitate the generation of additional predicted encoder strip transitions from which effective dot clock resolutions of 600, 1200, or more dots per inch could be generated from a 150 line per inch encoder strip. Transitions from opaque-to-transparent regions could be used to load the counters. The invention is also applicable to rotary encoders. The scope of the invention should, therefore, be interpreted only by the following claims.

We claim:

1. Apparatus for determining the relative position of a detector and an encoder scale as they move relative to each other, the encoder scale having alternating first and second regions, comprising:
   position detecting means for generating a first signal having a transition to a first state indicative of a position of the detector relative to a first region of the encoder scale;
   accumulating means for accumulating a value representing the elapsed time between successive transitions of the first signal to the first state;
   divider means for generating a second signal at a time proportional to a predetermined portion of the value; and
   clock signal means for generating a clock signal having a first clock transition responsive to the first signal and a second clock transition responsive to the second signal, thereby to produce a clock signal that indicates with accuracy the relative position of the detector and the encoder scale.

2. The apparatus of claim 1 in which any one of the accumulating means, divider means, and clock signal means is implemented in software.

3. The apparatus of claim 1 in which the encoder scale is linear.

4. The apparatus of claim 1 in which the accumulating means includes a first counter and divider means includes a presettable second counter that receives a count from the first counter to produce the second signal.

5. The apparatus of claim 4 in which the first counter is an up counter and the presettable second counter is a down counter.

6. The apparatus of claim 1 in which the predetermined portion of the value is one-half of the value.

7. The apparatus of claim 1 in which there are multiple predetermined portions of the value and the clock signal means generates second clock transitions responsive to the predetermined portions.

8. The apparatus of claim 1, further including transition masking means for selectively disabling predetermined alternate ones of the transitions of the first signal.

9. The apparatus of claim 1 in which the detector is of the photo-optical type.

10. Apparatus for determining the relative position of a print head and an encoder scale as they move relative to each other, the encoder scale having alternating first and second regions, comprising:
    position detecting means for generating a first signal having a transition to a first state indicative of a position of the print head relative to a first region of the encoder scale;
    accumulating means for accumulating a value representing the elapsed time between successive transitions of the first signal to the first state;
    divider means for generating a second signal at a time proportional to a predetermined portion of the value; and
    clock signal means for generating a clock signal having a first clock transition responsive to the first signal and a second clock transition responsive to the second signal, thereby to produce a clock signal that indicates with accuracy the relative position of the print head and the encoder scale.

11. The apparatus of claim 10 in which the accumulating means includes a first counter and divider means includes a presettable second counter that receives a count from the first counter to produce the second signal.

12. The apparatus of claim 11 in which the first counter is an up counter and the presettable second counter is a down counter.

13. The apparatus of claim 10 in which there are multiple predetermined portions of the value and the clock signal means generates second clock transitions responsive to the predetermined portions.

14. The apparatus of claim 10, further including transition masking means for selectively disabling predetermined alternate ones of the transitions of the first signal.

15. A method for determining the relative position of a detector and an encoder scale as they move relative to each other, the encoder scale having alternating first and second regions, comprising:
    generating a first signal indicative of the position of the detector relative to the first region and the second region;
    providing a value proportional to the elapsed time between indications of the first signal that the detector has entered successive first regions of the encoder scale; and
    using the value proportional to the elapsed time to predict the presence of the detector at a predetermined position between a different pair of first regions of the encoder scale and thereby to provide a position determination of better accuracy than that provided by the first signal relative to the second regions.

16. A method for determining the relative position of a print head and an encoder scale as they move relative to each other, the encoder scale having alternating first and second regions, comprising:

generating a first signal indicative of the position of the print head relative to the first and second regions, providing a value proportional to the elapsed time between indications of the first signal that the detector has entered successive first regions of the encoder scale; and using the value proportional to the elapsed time to predict the presence of the print head at a predetermined position between a different pair of first regions of the encoder scale and thereby to provide a position determination of better accuracy than that provided by the first signal relative to the second regions.

* * * * *